United States Patent
Keller

(10) Patent No.: US 8,043,911 B2
(45) Date of Patent: *Oct. 25, 2011

(54) METHODS OF FORMING SEMICONDUCTOR CONSTRUCTIONS

(75) Inventor: David J. Keller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 959 days.

This patent is subject to a terminal disclaimer.

(21) Appl. No.: 11/972,098

(22) Filed: Jan. 10, 2008

(65) Prior Publication Data

US 2008/0132013 A1      Jun. 5, 2008

Related U.S. Application Data

(63) Continuation of application No. 11/319,328, filed on Dec. 27, 2005, now Pat. No. 7,341,951.

(51) Int. Cl.
*H01L 21/8242*      (2006.01)

(52) U.S. Cl. ........ 438/241; 438/689; 438/773; 438/706; 257/336

(58) Field of Classification Search .......... 438/689, 438/241, 773, 706; 257/336
See application file for complete search history.

(56) References Cited

U.S. PATENT DOCUMENTS

| | | | |
|---|---|---|---|
| 6,103,631 A | 8/2000 | Soda et al. | |
| 7,030,499 B2 | 4/2006 | Hermes | |
| 7,119,024 B2 | 10/2006 | Fishburn et al. | |
| 7,341,951 B2* | 3/2008 | Keller | 438/706 |
| 2001/0044214 A1 | 11/2001 | Izawa | |
| 2002/0006715 A1 | 1/2002 | Chhagan et al. | |
| 2003/0143864 A1* | 7/2003 | Tanabe et al. | 438/773 |
| 2003/0234422 A1* | 12/2003 | Wang et al. | 257/336 |
| 2006/0060904 A1 | 3/2006 | Hong | |
| 2006/0183308 A1 | 8/2006 | Zhang et al. | |
| 2007/0056926 A1 | 3/2007 | Ko | |

OTHER PUBLICATIONS

Hori et al. (IEEE Transactions on Electron Devices, vol. 40, No. 9, Sep. (1993), pp. 1675-1681).*

* cited by examiner

*Primary Examiner* — Nadine G Norton
*Assistant Examiner* — Mahmoud Dahimene
(74) *Attorney, Agent, or Firm* — Wells St. John P.S.

(57) ABSTRACT

The invention includes methods of forming semiconductor constructions in which a single etch is utilized to penetrate through a titanium-containing layer and partially into a silicon-containing layer beneath the titanium-containing layer. The etch can utilize $CH_2F_2$. The silicon-containing layer can contain an n-type doped region and a p-type doped region. In some methods, the silicon-containing layer can contain an n-type doped region laterally adjacent a p-type doped region, and the processing can be utilized to form a transistor gate containing n-type doped silicon simultaneously with the formation of a transistor gate containing p-type doped silicon.

16 Claims, 6 Drawing Sheets

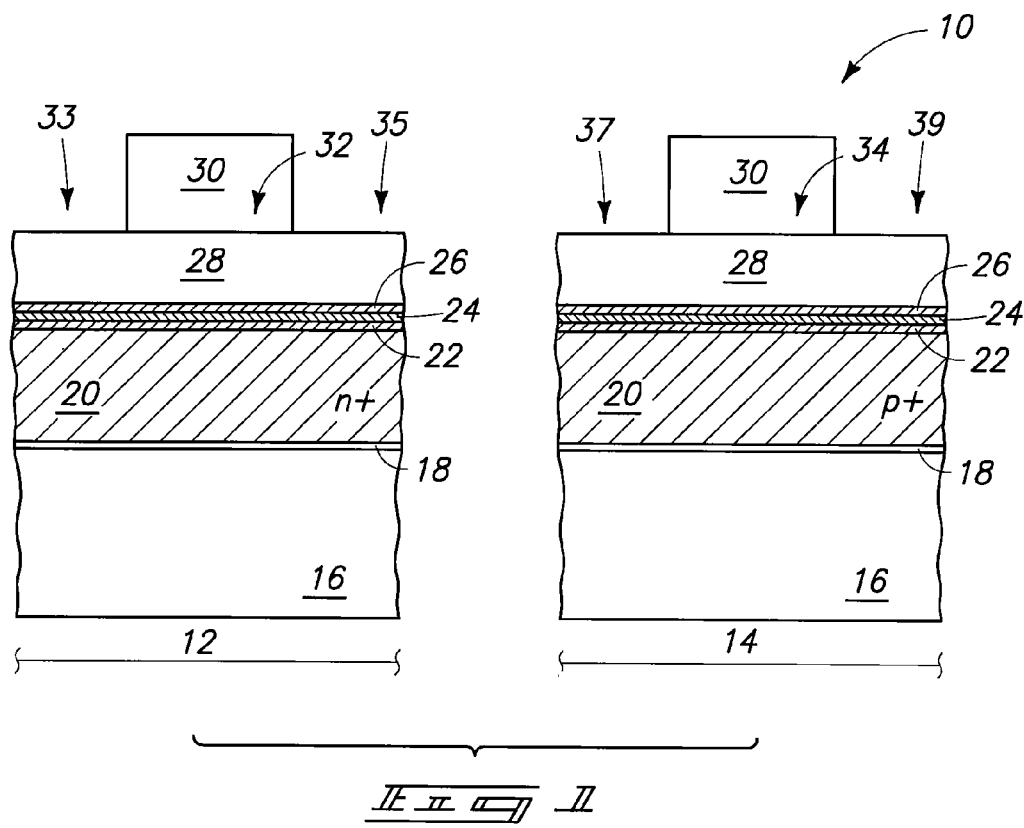
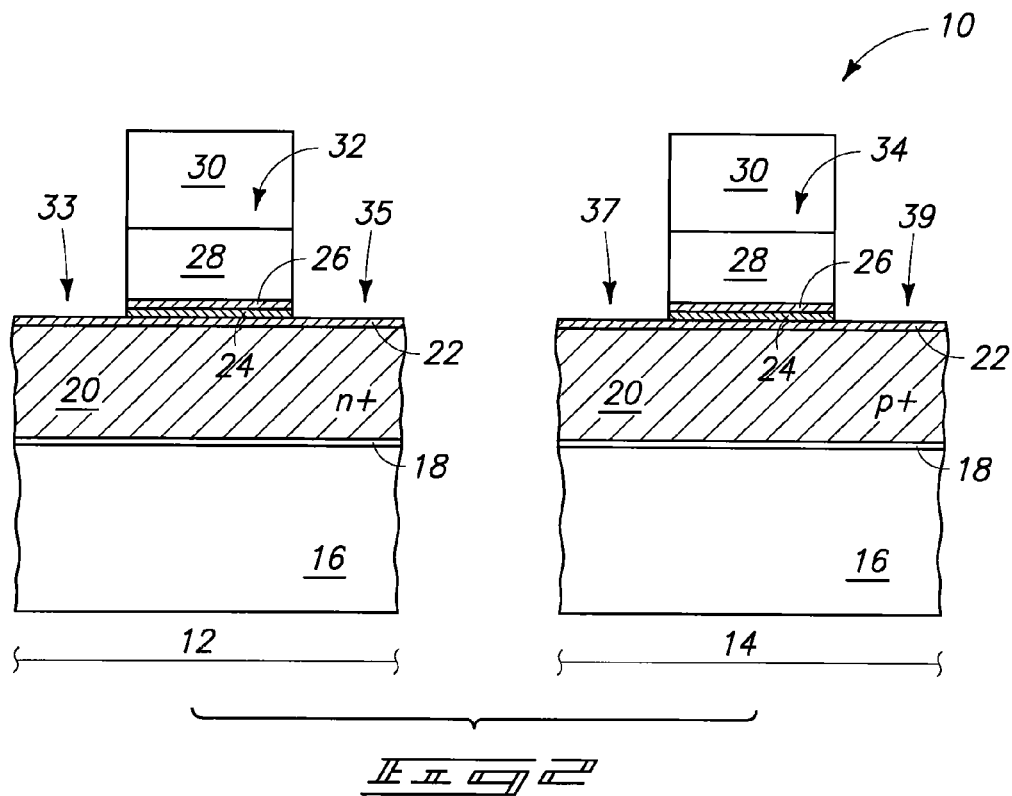

METHODS OF FORMING SEMICONDUCTOR CONSTRUCTIONS

RELATED PATENT DATA

This patent resulted from a continuation application of U.S. patent application Ser. No. 11/319,328, which was filed Dec. 27, 2005, now U.S. Pat. No. 7,341,951 and which is hereby incorporated herein by reference.

TECHNICAL FIELD

The invention pertains to methods of forming semiconductor constructions, and in particular aspects pertains to methods of simultaneously patterning transistor gates containing n-type doped silicon and transistor gates containing p-type doped silicon.

BACKGROUND OF THE INVENTION

Transistors are commonly utilized in integrated circuitry. The transistors will comprise a gate through which a pair of source/drain regions can be electrically coupled with one another. The transistor gate can comprise conductively-doped semiconductor material such as, for example, n-type doped silicon or p-type doped silicon.

It is frequently desired to optimize transistor performance relative to particular circuitry incorporating the transistor. Such optimization can include utilization of n-type doped silicon within the transistor gate in some applications, and in other applications such optimization can include utilization of p-type doped silicon within the transistor gate.

Integrated circuitry is typically formed over a semiconductor substrate, and it is not uncommon for transistor gates containing n-type doped silicon to be over one region of the substrate while transistor gates containing p-type doped silicon are over another region of the substrate. For instance, transistor gates containing n-type doped silicon can be desired for utilization across a memory array region of a substrate, and transistor gates containing p-type doped silicon can be desired for utilization in logic circuitry peripheral to the memory array region.

A continuing goal during fabrication of semiconductor constructions is to reduce process steps to save time and reduce costs. It would be desirable to develop processes by which transistor gates containing p-type doped silicon are simultaneously patterned with transistor gates containing n-type doped silicon. Some efforts have been made to accomplish this, but difficulties are encountered in that commonly-utilized silicon etches are fairly highly selective for one of n-type doped silicon and p-type doped silicon relative to the other. Thus, the etches tend to proceed much more rapidly through one of n-type doped silicon and p-type doped silicon relative to the other, which can result in significant over-etching in applications in which it is attempted to simultaneously pattern transistor gates containing p-type doped silicon with transistor gates containing n-type doped silicon.

As will become clear in the discussion of the present invention presented below, some aspects the invention address the above-discussed problems of simultaneously patterning transistor gates containing p-type doped silicon with transistor gates containing n-type doped silicon. However, it should be understood that even though the invention was motivated at least in part by a desire to address such problems, the invention has applications beyond this.

SUMMARY OF THE INVENTION

In one aspect, the invention includes a method of forming a semiconductor construction. A semiconductor substrate is provided which has a first region and a second region. A silicon-containing layer is formed across the first and second regions of the substrate. The silicon-containing layer is n-type doped across the first region and p-type doped across the second region. A patterned mask is provided over the substrate to define a first location over the first region where the silicon-containing layer is to be removed, and to define a second location over the second region where the silicon-containing layer is removed. The first and second locations are exposed to etching conditions utilizing $CH_2F_2$ to simultaneously etch the n-type doped silicon-containing layer of the first location and the p-type doped silicon-containing layer of the second location.

In one aspect, the invention includes another method of forming a semiconductor construction. A semiconductor substrate is provided, and a silicon-containing layer is formed across the substrate. A titanium-containing layer is formed across the silicon-containing layer. First etching conditions are utilized to etch through the titanium-containing layer and only partially into the silicon-containing layer. The first etching conditions remove at least about one-fourth of the thickness of the silicon-containing layer and leave a remaining portion of the thickness of the silicon-containing layer. The remaining portion of the silicon-containing layer thickness is removed with second etching conditions that are different from the first etching conditions. In some aspects, the first etching conditions utilize $Cl_2$ and $CH_2F_2$, and the second etching conditions utilize HBr and $O_2$.

In one aspect, the invention includes yet another method of forming a semiconductor construction. A semiconductor substrate is provided. The substrate has a first region and a second region. A gate oxide layer is formed across the first and second regions of the substrate. A silicon-containing layer is formed over the gate oxide layer and across the first and second regions of the substrate. The silicon-containing layer has a thickness. The silicon-containing layer is n-type doped across the first region, and is p-type doped across the second region. A titanium-containing layer is formed over the silicon-containing layer and across the first and second regions of the substrate. A metal nitride is formed over the titanium-containing layer and across the first and second regions of the substrate. An electrically insulative layer is formed over the metal nitride and across the first and second regions of the substrate. A patterned mask is provided over the electrically insulative layer to define a first transistor gate location over the first region of the substrate, and to define a second transistor gate location over the second region of the substrate. A pattern is transferred from the patterned mask through the electrically insulative layer, the metal nitride and the titanium-containing layer, and only partially into the silicon-containing layer. The transferring of the pattern includes a single etch which etches through the titanium-containing layer and into the silicon-containing layer. The partially-etched silicon-containing layer has an etched portion of a thickness and a remaining portion of its thickness. The transferring of the pattern forms a first partial gate structure over the first region and a second partial gate structure over the second region. The first and second partial gate structures have sidewalls comprising the titanium-containing layer, metal nitride, and etched portion of the silicon-containing layer thickness. Spacers are formed along the sidewalls of the first and second partial gate structures. After the spacers are formed, first and second transistor gates are formed from the first and second partial gate structures by etching through the remaining portion of the silicon-containing layer thickness. The first and second transistor gates have exposed surfaces of the silicon-containing layer. The exposed surfaces of the silicon-containing layer of the first and second transistor gates are oxidized, and source/drain regions are formed within the substrate proximate the first and second transistor gates.

BRIEF DESCRIPTION OF THE DRAWINGS

Preferred embodiments of the invention are described below with reference to the following accompanying drawings.

FIG. 1 is a diagrammatic, cross-sectional view of fragments of a semiconductor construction at a preliminary processing stage of an exemplary aspect of the present invention.

FIG. 2 is a view of the FIG. 1 fragments shown at a processing stage subsequent to that of FIG. 1.

DETAILED DESCRIPTION OF THE PREFERRED EMBODIMENTS

Figure 3:
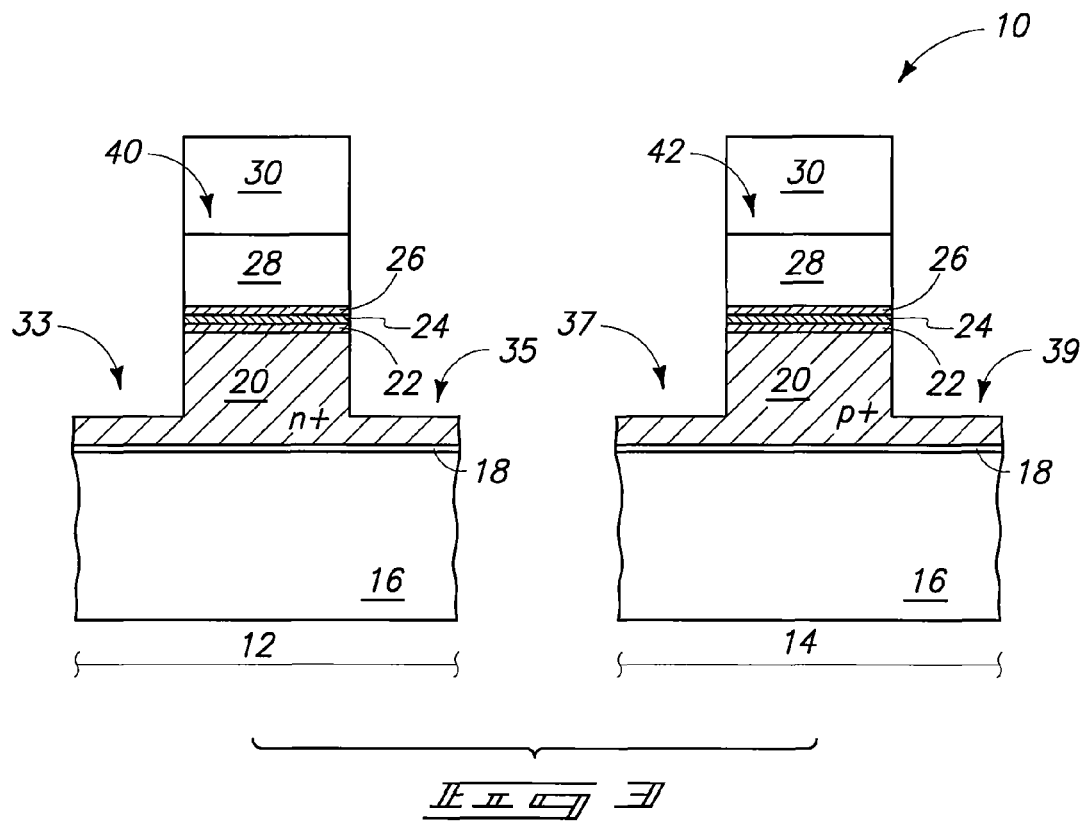
FIG. 3 is a view of the FIG. 1 fragments shown at a processing stage subsequent to that of FIG. 2.

This disclosure of the invention is submitted in furtherance of the constitutional purposes of the U.S. Patent Laws "to promote the progress of science and useful arts" (Article 1, Section 8).

In some aspects, the invention pertains to methodology for forming transistor gates, and specifically for forming a transistor gate comprising n-type doped semiconductor material simultaneously with formation of a transistor gate comprising p-type doped semiconductor material. An exemplary aspect of the present invention is described with reference to FIGS. 1-6.

Referring to FIG. 1, a semiconductor construction 10 is illustrated to comprise a pair of fragments 12 and 14. Such fragments can be referred to as first and second regions of the semiconductor construction, respectively.

The fragments comprise a semiconductor substrate 16 having various layers thereover. Substrate 16 can, for example, comprise, consist essentially of, or consist of, monocrystalline silicon lightly-doped with background dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The layers formed over substrate 16 include an electrically insulative layer 18, and a conductively-doped silicon-containing layer 20.

The electrically insulative layer 18 can, for example, comprise, consist essentially of, or consist of silicon dioxide, and can be referred to as a gate oxide.

The conductively-doped silicon-containing layer 20 can comprise silicon in any suitable form, including polycrystalline and/or amorphous form. Layer 20 is shown to be n-type doped in fragment 12, and p-type doped in fragment 14. Ultimately, the various layers associated with fragments 12 and 14 are incorporated into transistor gates. The n-type doping of layer 20 within fragment 12 can optimize performance of certain transistors, while the p-type doping within fragment 14 can optimize performance of other transistors. For instance, fragment 12 can correspond to a memory array region, and the transistors formed thereon can ultimately be utilized in combination with charge storage devices (such as, for example, capacitors) to form a dynamic random access memory (DRAM) array; and the transistors formed within fragment 14 can ultimately be incorporated into logic devices peripheral to the memory array.

A titanium-containing layer 22, metal-nitride-containing layer 24, and metal-containing layer 26 are formed over silicon-containing layer 20. The titanium-containing layer is a barrier between the metal-nitride-containing layer and the silicon-containing layer to avoid nitridation of the silicon-containing layer by nitrogen from the metal-nitride-containing layer. In the absence of the barrier layer, direct contact between the silicon-containing layer 20 with metal-nitride-containing layer 24 could result in formation of silicon nitride. Silicon nitride is an electrically insulative material, and would be problematic at the interface between the conductive materials that are ultimately to be incorporated into a transistor gate.

Titanium-containing layer 22 can comprise, consist essentially of, or consist of titanium, and can be formed by any suitable method, including, for example, chemical vapor deposition, atomic layer deposition, and/or physical vapor deposition.

Metal-nitride-containing layer 24 can comprise any suitable composition or combination of compositions, and in particular aspects will comprise, consist essentially of, or consist of tungsten nitride. The metal nitride of layer 24 can be formed by any suitable method, including, for example, chemical vapor deposition, atomic layer deposition, and/or physical vapor deposition.

Metal-containing layer 26 can comprise any suitable composition or combination of compositions, and in particular aspects will comprise, consist essentially of, or consist of tungsten. Layer 26 can be formed by any suitable method, including, for example, chemical vapor deposition, atomic layer deposition, and/or physical vapor deposition.

An electrically insulative capping layer 28 is over metal-containing layer 26, and a patterned mask 30 is over layer 28.

Electrically insulative layer 28 comprise any suitable composition or combination of compositions, and in particular aspects will comprise, consist essentially of, or consist of silicon nitride.

Mask 30 can comprise any suitable composition or combination of compositions, and in particular aspects will correspond to photolithographically patterned photoresist.

The patterned mask 30 defines locations 32 and 34 directly beneath the mask where transistor gates are to be formed; and defines locations 33, 35, 37 and 39 where layers 20, 22, 24, 26 and 28 are to be removed. The location 32 associated with fragment 12 can be referred to as a first transistor gate location, and the location 34 associated with fragment 14 can be referred to as a second transistor gate location. The locations 33 and 35 associated with fragment 12 can be referred to as first locations where layers are to be removed during formation of a first transistor gate, and the locations 37 and 39 associated with fragment 14 can be referred to as second locations where layers are to be removed during formation of a second transistor gate.

Referring to FIG. 2, etching is conducted to transfer a pattern from patterned mask 30 through the underlying layers 24, 26 and 28. The etching can comprise any suitable etch step or combination of etch steps. The etching exposes titanium-containing layer 22 within locations 33, 35, 37 and 39.

Referring to FIG. 3, an etch is utilized to remove titanium-containing layer 22 from locations 33, 35, 37 and 39, and to remove some of n-type doped semiconductor layer 20 from locations 33 and 35 while removing some of p-type doped semiconductor layer 20 from locations 37 and 39. The etch can utilize $CH_2F_2$. In some aspects, the $CH_2F_2$ can be utilized in combination with $Cl_2$, and in such aspects the ratio of $CH_2F_2$ to $Cl_2$ can be from about 1:5 to about 1.5:5. The etch can be conducted at a temperature of about 70° C. In particular aspects, the etch is conducted in a Lam 2300 poly etcher under a pressure of 5 mTorr, a top power of 275 watts, a bottom power of 75 watts, a flow rate of $Cl_2$ of 30 standard cubic centimeters per minute (sccm), and a flow rate of $CH_2F_2$ of 10 sccm. In typical applications, the flow rate of the $CH_2F_2$ can be from about 5 sccm to about 50 sccm, and the flow rate of the $Cl_2$ can be from about 30 sccm to about 60 sccm.

The etch is somewhat non-selective for n-type doped silicon relative to p-type doped silicon, and accordingly removes the n-type doped silicon at about the same rate as the p-type doped silicon. The etch is typically not completely non-selective relative to n-type doped silicon and p-type doped silicon, and accordingly one of the n-type doped silicon and p-type doped silicon will typically be removed at a slightly higher rate than the other. However, the etch is more non-selective than typical prior art silicon etches. For instance, an etch of the present invention can leave a difference in thickness of etched n-type silicon to etched p-type silicon of only about 60 Å (in other words, a delta between n-type silicon and p-type silicon of 60 Å) whereas prior art processes would leave a difference in thickness of about 120 Å (or in other words, about twice as large of a delta between the remaining p-type silicon thickness and the remaining n-type silicon thickness).

In the shown aspect of the invention, the etch into the silicon-containing layer 20 only extends partially into such layer. In other words, the silicon-containing layer 20 has an initial thickness prior to the etch, and has a reduced thickness remaining after the etch. The etch will typically remove at least about one-fourth of the initial thickness of the silicon-containing layer 20, so the remaining thickness of silicon-containing layer 20 within each of fragments 12 and 14 is less than or equal to about three-fourths of the initial thickness of such layer. In some aspects, the etch will remove at least one-half of the initial thickness of the silicon-containing layer 20, or even at least about three-fourths of the initial thickness of the silicon-containing layer 20. It can be advantageous for this relatively non-selective etch to remove a large amount of the silicon-containing layer 20, in that the remainder of the silicon-containing layer 20 will be removed with a less non-selective etch (as discussed below with reference to FIG. 5). It is generally desirable to remove the vast majority of silicon-containing layer 20 with an etch that etches p-type doped material and n-type doped material somewhat non-selectively relative to one another to avoid complications that occur if one type of doped material is etched much more rapidly than the other.

If layer 18 comprises silicon dioxide, it is preferred that the $CH_2F_2$-based etch of the silicon-containing layer 20 not extend entirely through the layer, in that such etch is relatively non-selective for silicon of layer 20 relative to silicon oxide of gate oxide 18. If layer 18 comprises an insulative material other than silicon oxide so that the $CH_2F_2$-based etch has selectivity for layer 20 relative to layer 18, the etch can extend entirely through layer 20.

The patterned structures formed over fragments 12 and 14 from the partially-etched layered 20 and the layers 22, 24, 26 and 28 can be referred to as first and second partial gate structures 40 and 42. Such structures have sidewalls comprising titanium-containing layer 22, metal-nitride-containing layer 24, metal-containing layer 26, insulative material layer 28, and the etched portions of layer 20.

Figure 4:
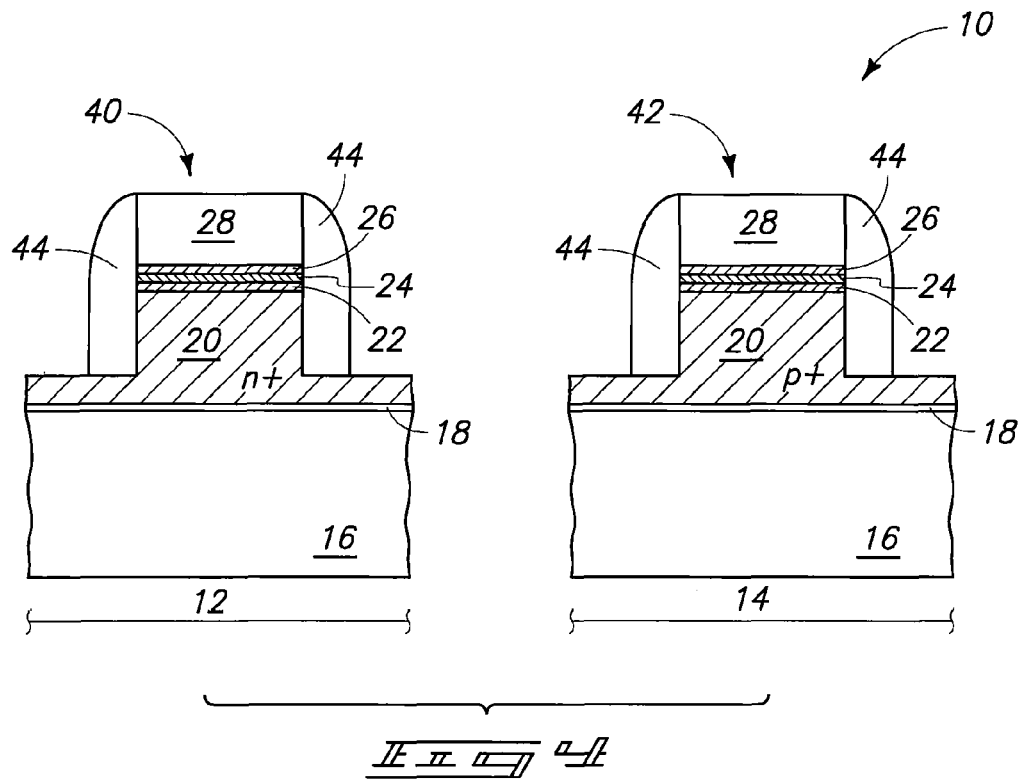
FIG. 4 is a view of the FIG. 1 fragments shown at a processing stage subsequent to that of FIG. 3.

Referring to FIG. 4, patterned mask 30 (FIG. 3) is removed, and spacers 44 are formed along the sidewalls of the first and second partial gate structures 40 and 42. The spacers can comprise any suitable composition or combination of compositions, and typically will comprise, consist essentially of, or consist of silicon nitride. The spacers can be formed by providing a layer of suitable material across an upper surface of construction 10, and then anisotropically etching such layer.

Figure 5:
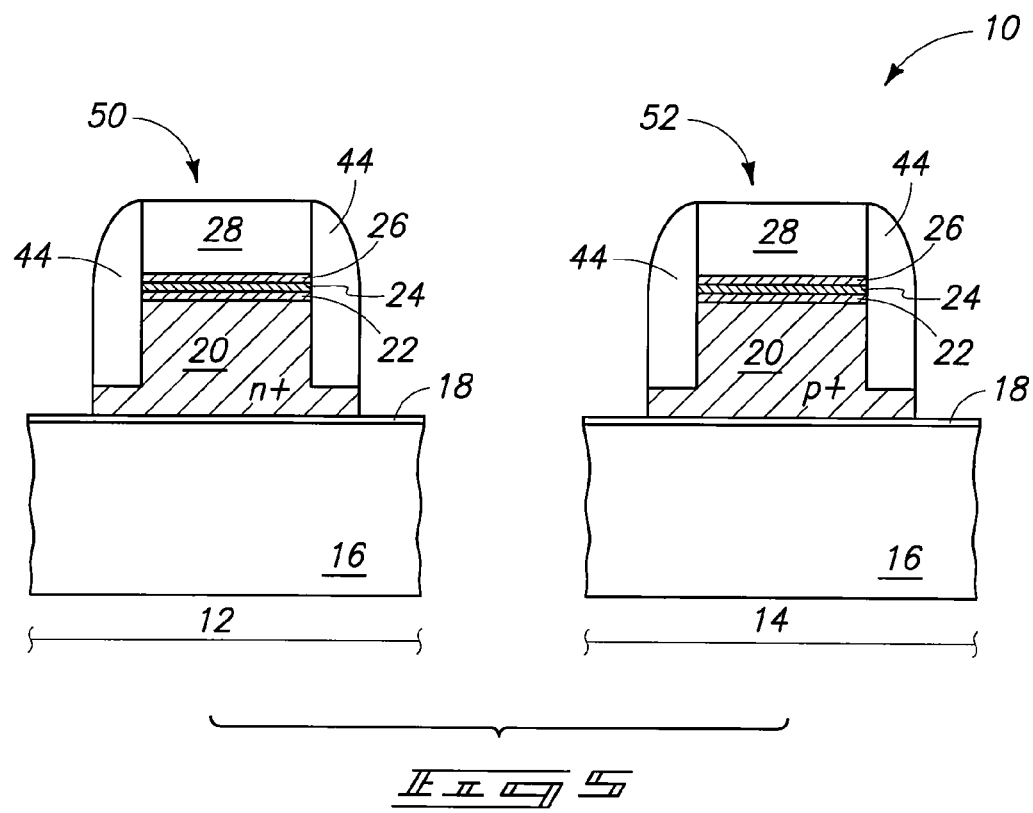
FIG. 5 is a view of the FIG. 1 fragments shown at a processing stage subsequent to that of FIG. 4.

Referring to FIG. 5, an etch is utilized to extend through the remaining portion of layer 20 and form first and second transistor gates 50 and 52 from the partial gate structures 40 and 42, respectively, of FIG. 4. The etch utilized to remove the remaining portions of silicon-containing layer 20 can be a conventional silicon etch, such as, for example, an etch utilizing HBr and $O_2$.

The etch utilized to remove exposed portions of layer 20 at the processing stage of FIG. 5 is preferably highly selective for silicon-containing layer 20 relative to the material of layer 18 (which, as discussed above, can be silicon dioxide). Such etches also tend to be selective for one of p-type doped silicon and n-type doped silicon relative to the other. Because only a relatively narrow amount of silicon-containing layer 20 is removed at the processing stage of FIG. 5, such selectivity is less problematic than it would be without the first etch of FIG. 3 to reduce the thickness of layer 20. However, if the silicon-containing layer 20 that is to be removed at the processing stage of FIG. 5 is too thick, problems can still occur in that pitting of layer 18 can occur proximate one of the gates 50 and 52 while the semiconductor material of the other gate is still being etched.

In some aspects, the etch described above with reference to FIG. 3 (i.e., the etch that penetrates partially into layer 20) can be referred to as a first etch of the material of layer 20, and the etch of FIG. 5 (i.e., the etch that removes exposed portions of layer 20) can referred to as a second etch of the material of layer 20.

Figure 6:
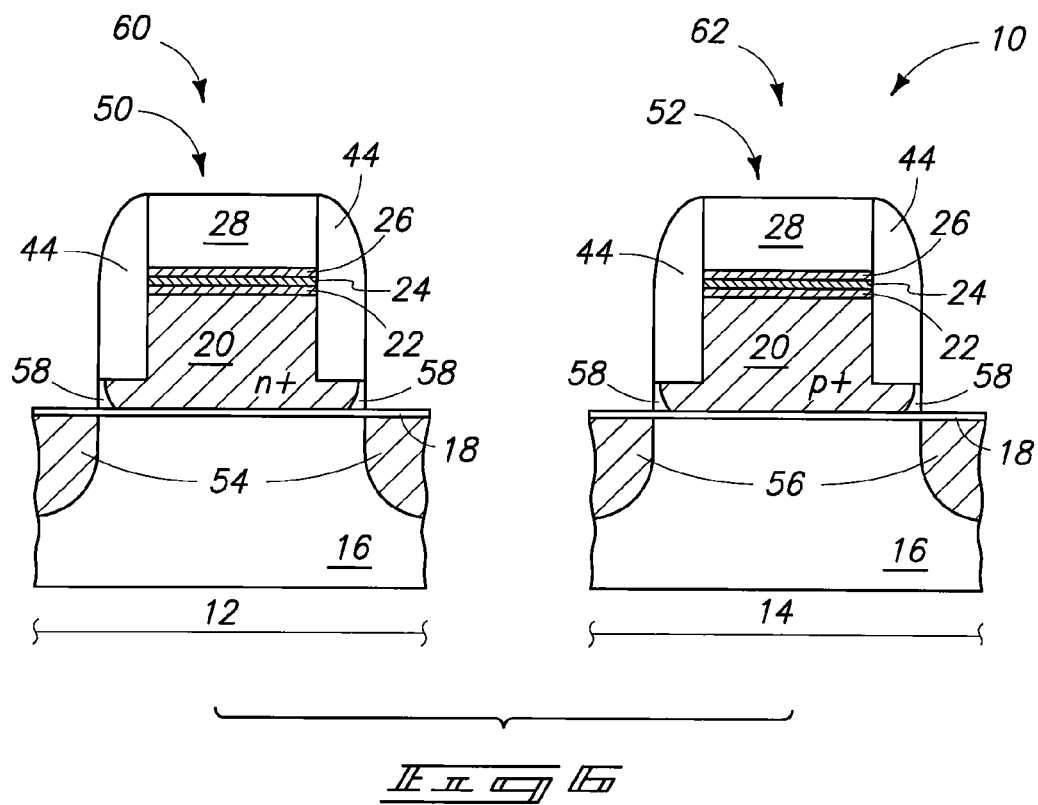
FIG. 6 is a view of the FIG. 1 fragments shown at a processing stage subsequent to that of FIG. 5.

Referring to FIG. 6, first and second transistor gates 50 and 52 are incorporated into first and second transistors 60 and 62, respectively, by forming source/drain regions 54 proximate gate 50, and source/drain regions 56 proximate gate 52. The source/drain regions 54 and 56 are conductively-doped regions extending into semiconductor substrate 16, and can be conventional source/drain regions which, as is known to persons of ordinary skill the art, can be p-type doped or n-type doped. The source/drain regions can be implanted through the layer 18, as shown. Alternatively, the layer 18 can be stripped from over the locations of the source/drain regions prior to the implant of the source/drain regions.

Outer sidewalls of layer 20 are oxidized to form outer oxide surfaces 58, which, as is known to persons of ordinary skill in the art, can correspond to so-called smiling gate oxidation utilized to improve transistor performance. The spacers 44 protect sidewall surfaces of metal-nitride-containing layer 24 and metal-containing layer 26 from oxidation that can occur if such surfaces were exposed to the oxidizing conditions utilized to form oxide 58. The oxide 58 can comprise, consist essentially of, or consist of silicon oxide, and accordingly can have the same composition as gate oxide 18.

Figure 7:
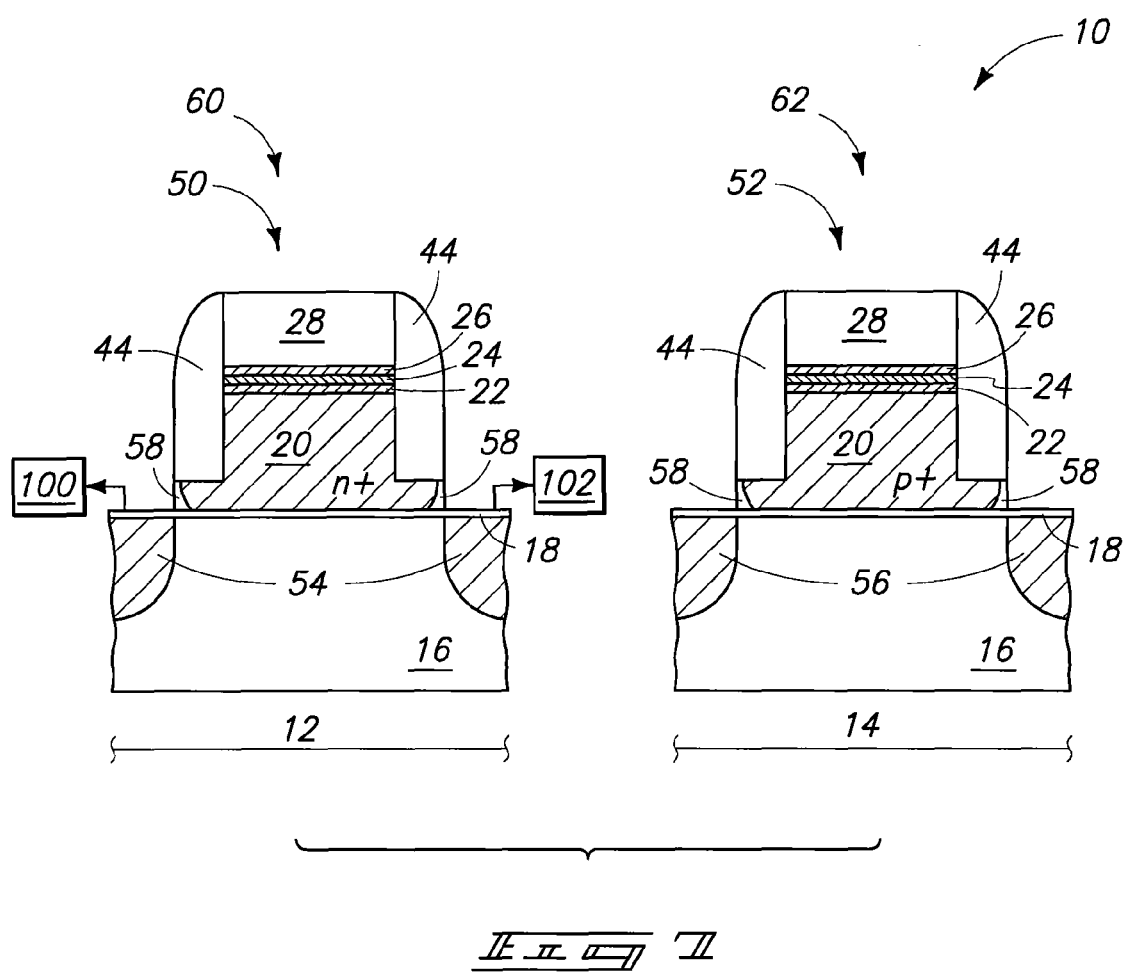
FIG. 7 is a view of the FIG. 1 fragments shown at a processing stage subsequent to that of FIG. 6.

Referring to FIG. 7, one of the source/drain regions 54 is connected to a charge storage device 100 (such as, for example, a capacitor) and the other is connected to a bitline 102 so that the transistor 60 is incorporated into a DRAM unit cell of a DRAM array. The source/drain regions 56 of transistor 62 can be connected to other circuit devices (not shown) to incorporate transistor 62 into logic circuitry.

Figure 8:
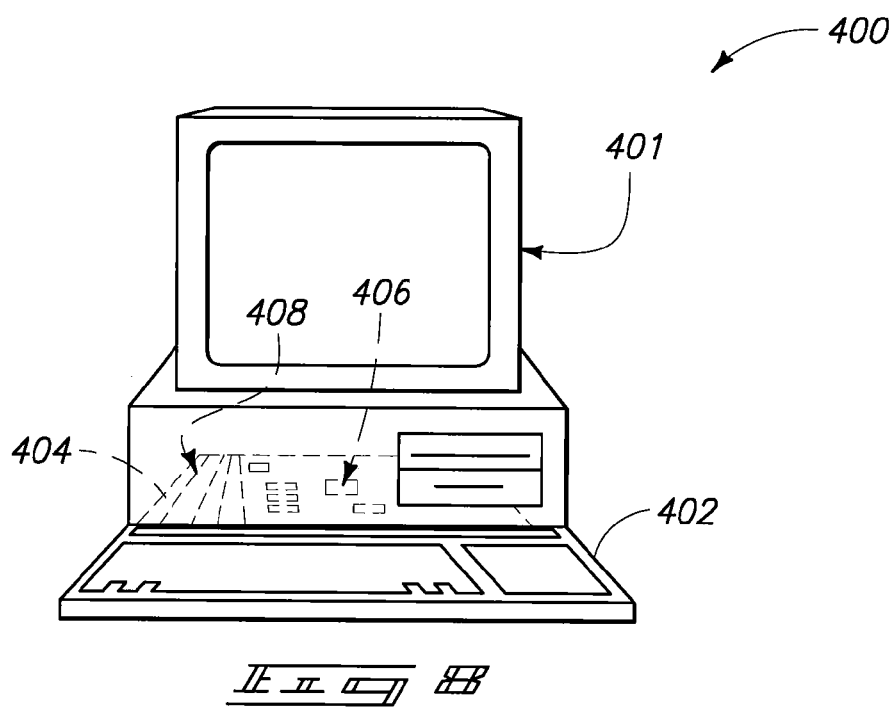
FIG. 8 is a diagrammatic view of a computer illustrating an exemplary application of the present invention.
Figure 9:
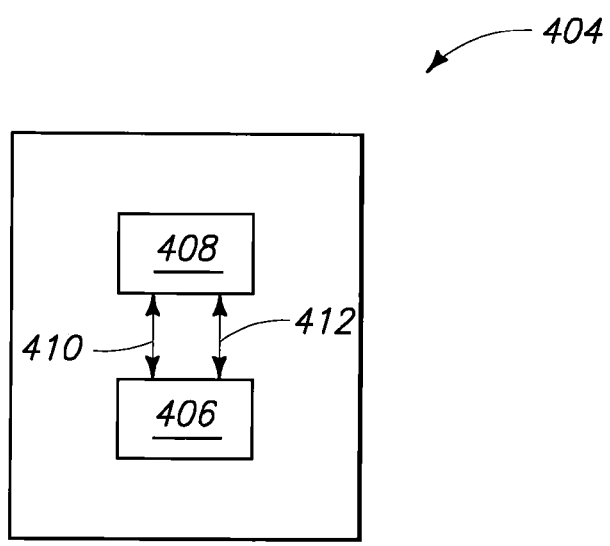
FIG. 9 is a block diagram showing particular features of the motherboard of the FIG. 8 computer.

Memory and logic constructions comprising transistors formed in accordance with aspects of the present invention can be incorporated into numerous integrated circuit systems. FIG. 8 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 9. In such block diagram, the addressing circuitry is illustrated as 410 and the read circuitry is illustrated as 412. Various components of computer system 400, including processor 406, can comprise one or more of the memory constructions and logic constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention.

Figure 10:
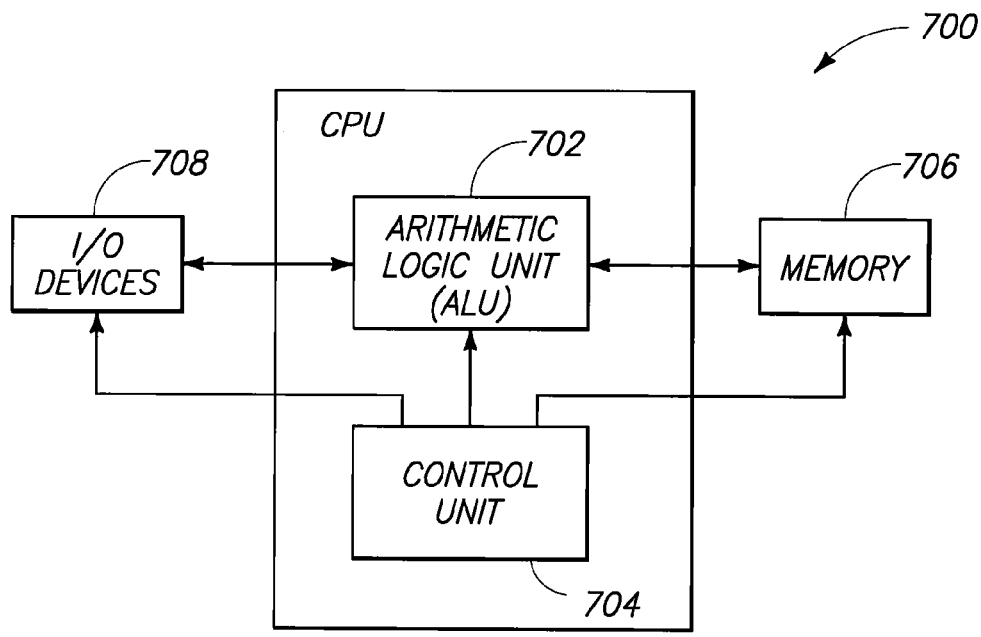
FIG. 10 is a high-level block diagram of an electronic system according to an exemplary aspect of the present invention.

FIG. 10 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions and/or logic constructions in accordance with various aspects of the present invention.

Figure 11:
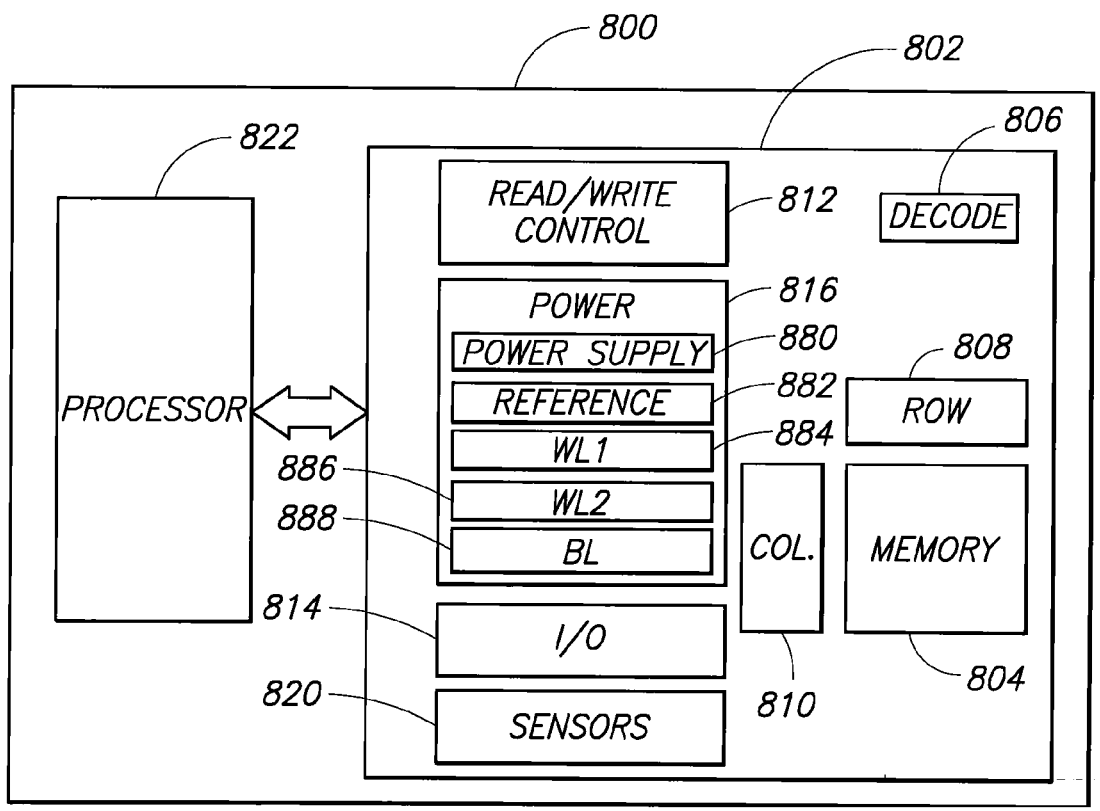
FIG. 11 is a simplified block diagram of an exemplary memory device according to an aspect of the present invention.

FIG. 11 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first word-line with pulses, circuitry 886 for providing the second word-line with pulses, and circuitry 888 for providing the bitline with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction and/or logic construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One Of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a semiconductor construction, comprising:
    forming a silicon-containing layer over a semiconductor substrate; the silicon-containing layer being n-type doped across a first region of the semiconductor substrate, and being p-type doped across a second region of the semiconductor substrate;
    forming multiple materials over the silicon-containing layer and across the first and second regions of the semiconductor substrate;
    etching through the multiple materials, and only partially into the silicon-containing layer to form a first partial gate structure over the first region and to form a second partial gate structure over the second region; the first and second partial gate structures having sidewalls comprising the multiple materials and comprising an etched portion of the silicon-containing layer; the etching partially into the silicon-containing layer being conducted with first etching conditions that are substantially non-selective between n-type doped silicon and p-type doped silicon;
    forming spacers along the sidewalls of the first and second partial gate structures; and
    after forming the spacers, etching through a remaining portion of the silicon-containing layer to form first and second transistor gates from the first and second partial gate structures; the etching through the remaining portion of the silicon-containing layer being conducted with second etching conditions that have higher selectivity than the first etching conditions between n-type doped silicon and p-type doped silicon.

2. A method of forming a semiconductor construction, comprising:
    forming a gate oxide layer across a semiconductor substrate;
    forming a silicon-containing layer over the gate oxide layer; the silicon-containing layer having a thickness; the silicon-containing layer being n-type doped across a first region of the semiconductor substrate, and being p-type doped across a second region of the semiconductor substrate;
    forming multiple materials over the silicon-containing layer and across the first and second regions of the semiconductor substrate;
    forming a patterned mask over the multiple materials to define a first transistor gate location over the first region of the semiconductor substrate, and to define a second transistor gate location over the second region of the semiconductor substrate;
    transferring a pattern from the patterned mask through the multiple materials, and only partially into the silicon-containing layer; the partially-etched silicon-containing layer having an etched portion of its thickness and a remaining portion of its thickness; the transferring of the pattern forming a first partial gate structure over the first region and a second partial gate structure over the second region; the first and second partial gate structures having sidewalls comprising the multiple materials and the etched portion of the silicon-containing layer thickness; the etching partially into the silicon-containing layer utilizing $Cl_2$ and $CH_2F_2$;
    forming spacers along the sidewalls of the first and second partial gate structures;
    after forming the spacers, etching through the remaining portion of the silicon-containing layer thickness to form first and second transistor gates from the first and second partial gate structures; the first and second transistor gates having exposed surfaces of the silicon-containing layer; the etching through the remaining portion of the silicon-containing layer utilizing an etch selective for n-type doped silicon and p-type doped silicon relative to the gate oxide;
    oxidizing the exposed surfaces of the silicon-containing layer of the first and second transistor gates; and
    forming source/drain regions within the substrate proximate the first and second transistor gates.

3. A method of forming a semiconductor construction, comprising:
    forming a gate oxide layer across first and second regions of a monocrystalline silicon-containing semiconductor substrate;
    forming a silicon-containing layer over the gate oxide layer and across the first and second regions of the substrate; the silicon-containing layer having a thickness; the silicon-containing layer being n-type doped across the first region, and being p-type doped across the second region;
    forming a titanium-containing layer over the silicon-containing layer and across the first and second regions of the substrate;
    forming a metal nitride over the titanium-containing layer and across the first and second regions of the substrate;
    forming an electrically insulative layer over the metal nitride and across the first and second regions of the substrate;
    providing a patterned mask over the electrically insulative layer to define a first transistor gate location over the first region of the substrate, and to define a second transistor gate location over the second region of the substrate;
    transferring a pattern from the patterned mask through the electrically insulative layer, the metal nitride and the titanium-containing layer, and only partially into the silicon-containing layer; the transferring of the pattern including a single etch which etches through the titanium-containing layer and into the silicon-containing layer; the partially-etched silicon-containing layer having an etched portion of its thickness and a remaining portion of its thickness; the transferring of the pattern forming a first partial gate structure over the first region and a second partial gate structure over the second region; the first and second partial gate structures having sidewalls comprising the titanium-containing layer, metal nitride, and etched portion of the silicon-containing layer thickness;
    forming spacers along the sidewalls of the first and second partial gate structures;

after forming the spacers, etching through the remaining portion of the silicon-containing layer thickness to form first and second transistor gates from the first and second partial gate structures; the first and second transistor gates having exposed surfaces of the silicon-containing layer;

oxidizing the exposed surfaces of the silicon-containing layer of the first and second transistor gates; and forming source/drain regions within the substrate proximate the first and second transistor gates.

4. The method of claim 3 further comprising forming a metal-containing layer over the metal nitride, and across the first and second regions of the substrate; and wherein the electrically insulative layer is formed over the metal-containing layer.

5. The method of claim 4 wherein the metal-containing layer consists essentially of tungsten, and wherein the metal nitride consists essentially of tungsten nitride.

6. The method of claim 5 wherein the single etch which etches through the titanium-containing layer and into the silicon-containing layer etches through at least one-fourth of the thickness of the silicon-containing layer.

7. The method of claim 3 wherein the single etch which etches through the titanium-containing layer and into the silicon-containing layer utilizes $CH_2F_2$.

8. The method of claim 3 wherein the single etch which etches through the titanium-containing layer and into the silicon-containing layer utilizes $Cl_2$ and $CH_2F_2$.

9. The method of claim 8 wherein the ratio of $CH_2F_2$ to $Cl_2$ is from about 1:5 to about 1.5:5.

10. The method of claim 9 wherein the single etch which etches through the titanium-containing layer and into the silicon-containing layer utilizes a temperature of about 70° C.

11. The method of claim 3 wherein the etching through the remaining portion of the silicon-containing layer thickness utilizes HBr and $O_2$.

12. The method of claim 3 wherein:
the single etch which etches through the titanium-containing layer and into the silicon-containing layer utilizes $Cl_2$ and $CH_2F_2$; and
the etching through the remaining portion of the silicon-containing layer thickness utilizes HBr and $O_2$.

13. The method of claim 3 wherein the source/drain regions proximate the first transistor gate are a pair of first source/drain regions, and further comprising forming a DRAM unit cell of a DRAM array by forming a charge storage device electrically coupled with one of the first source/drain regions and forming a bitline electrically coupled with the other of the first source/drain regions.

14. The method of claim 1 wherein the first etching conditions utilize $Cl_2$ and $CH_2F_2$; and wherein the second etching conditions utilize HBr and $O_2$.

15. A method of forming a semiconductor construction, comprising:

forming a silicon-containing layer over an oxide; the silicon-containing layer being n-type doped across a first region of the oxide, and being p-type doped across a second region of the oxide;

etching only partially into the silicon-containing layer to form a first partial structure over the first region and to form a second partial structure over the second region; the first and second partial structures having sidewalls comprising an etched portion of the silicon-containing layer; the etch partially into the silicon-containing layer being conducted with first etching conditions that are relatively non-selective between n-type doped silicon and p-type doped silicon;

forming spacers along the sidewalls of the first and second partial structures; and after forming the spacers, etching through a remaining portion of the silicon-containing layer to the oxide; the etching through the remaining portion of the silicon-containing layer being conducted with second etching conditions that have higher selectivity than the first etching conditions between n-type doped silicon and p-type doped silicon.

16. A method of forming a semiconductor construction, comprising:

forming an oxide across a semiconductor substrate;

forming a silicon-containing layer over the oxide; the silicon-containing layer having a thickness; the silicon-containing layer having an n-type doped segment across a first region of the semiconductor substrate, and having a p-type doped segment across a second region of the semiconductor substrate;

forming a patterned mask over the silicon-containing layer;

partially etching through the silicon-containing layer to transfer a pattern from the patterned mask only partially through the n-type doped and p-type doped segments of the silicon-containing layer; the partially-etched silicon-containing layer having an etched portion of its thickness and a remaining portion of its thickness; the transferring of the pattern forming a first partial structure within the n-type doped segment over the first region and forming a second partial structure within the p-type doped segment over the second region; the first and second partial structures having sidewalls comprising the etched portion of the silicon-containing layer thickness; the etching partially through the silicon-containing layer utilizing $Cl_2$ and $CH_2F_2$;

forming spacers along the sidewalls of the first and second partial structures; and after forming the spacers, etching through the remaining portion of the silicon-containing layer thickness to the oxide to form first and second structures from the first and second partial structures; the etching through the remaining portion of the silicon-containing layer utilizing an etch selective for n-type doped silicon and p-type doped silicon relative to the gate oxide.

* * * * *